United States Patent [19]

Jiang

[11] Patent Number: 5,712,200

[45] Date of Patent: Jan. 27, 1998

[54] N-WELL RESISTOR AS A BALLAST RESISTOR FOR OUTPUT MOSFET

[75] Inventor: Chun Jiang, San Jose, Calif.

[73] Assignee: VLSI Technology, Inc., San Jose, Calif.

[21] Appl. No.: 801,173

[22] Filed: Feb. 18, 1997

Related U.S. Application Data

[62] Division of Ser. No. 586,041, Jan. 16, 1996, Pat. No. 5,637,902.

[51] Int. Cl.$^6$ ................................................. H01L 21/70
[52] U.S. Cl. ........................ 438/238; 438/279; 438/210
[58] Field of Search ............................ 437/47, 52, 60, 437/918; 438/238, 279, 210

[56] References Cited

U.S. PATENT DOCUMENTS

| | | | |
|---|---|---|---|
| 5,595,925 | 1/1997 | Chen et al. | 437/52 |
| 5,597,765 | 1/1997 | Yilmaz et al. | 437/203 |
| 5,641,699 | 6/1997 | Hirase et al. | 438/130 |
| 5,646,060 | 7/1997 | Chang et al. | 437/43 |

*Primary Examiner*—Jey Tsai
*Assistant Examiner*—Joni Y. Chang
*Attorney, Agent, or Firm*—Douglas L. Weller

[57] ABSTRACT

A resistor formed in a well adjacent to a transistor serves as a ballast resistor for the transistor. The transistor is formed in a first region on a substrate. The first region is of a first conductivity type. A well of second conductivity type is formed adjacent to the first region. A gate region is formed over a portion of the first region. Concurrently, a covering is formed over a first area of the well. The covering and the gate region are comprised of the same material. Source/drain regions of the second conductivity type are formed on either side of the gate region. The source/drain regions are of the first conductivity type. A first source/drain region extends into the well. Concurrent to the forming of the source drain regions, a doped region is formed within the well. The doped region and the first source/drain region have the same doping density. The doped region is physically separated from the first source/drain region by the first area of the well. Contact regions for the transistor are formed within the second source/drain region and within the doped region.

6 Claims, 2 Drawing Sheets

N-WELL RESISTOR AS A BALLAST RESISTOR FOR OUTPUT MOSFET

CROSS REFERENCE TO RELATED APPLICATION

This application is a division of application Ser. No. 08/586,041, filed Jan. 16, 1996 U.S. Pat. No. 5,637,902.

BACKGROUND

This invention relates generally to electrostatic discharge effect on input/output circuits and particularly to protection of output circuits of semiconductor devices from damage resulting from electrostatic discharge.

Electrostatic discharge (ESD) can be a source of destruction for semiconductor devices. Various output protection circuits may be used to protect the output circuits from electrostatic discharge damage. To increase the ESD robustness of CMOS output circuits, an extra long N-diffusion layer of approximately two to five micrometers long may be added between the drain contact and the polysilicon gate of NMOSFET output devices. The area of the N diffusion layer can be as large as thirty to fifty percent of the total NMOSFET output devices. This can be a significant cost in area for high density sub-halfmicron CMOS I/O circuits.

SUMMARY OF THE INVENTION

In accordance with the preferred embodiment of the present invention, a resistor formed in a well adjacent to a transistor serves as a ballast resistor for the transistor. The transistor is formed in a first region on a substrate. The first region is of a first conductivity type. The first region is, for example, a well of P-type conductivity. A well of second conductivity type is formed adjacent to the first region. For example, the well is of N-type conductivity. A gate region is formed over a portion of the first region. Concurrently, a covering is formed over a first area of the well. The covering and the gate region are comprised of the same material. For example the material comprises polysilicon. Source/drain regions of the second conductivity type are formed on either side of the gate region. The source/drain regions are of the first conductivity type, e.g., N-type conductivity. A first source/drain region extends into the well. Concurrent to the forming of the source drain regions, a doped region is formed within the well. The doped region and the first source/drain region have the same doping density. The doped region is physically separated from the first source/drain region by the first area of the well. Contact regions for the transistor are formed within the second source/drain region and within the doped region.

The present invention allows for efficient construction of a ballast resistor for an output MOSFET. The resistor is constructed without the requirement of adding additional processing steps. Since the resistivity of N-well material is significantly greater than N-diffusion material (used to construct source/drain), the resistor takes up significantly less area than a conventional resistor while increasing the ballast resistance. Further, the N-well transistor is self-aligned.

DESCRIPTION OF THE PREFERRED EMBODIMENT

Figure 1:
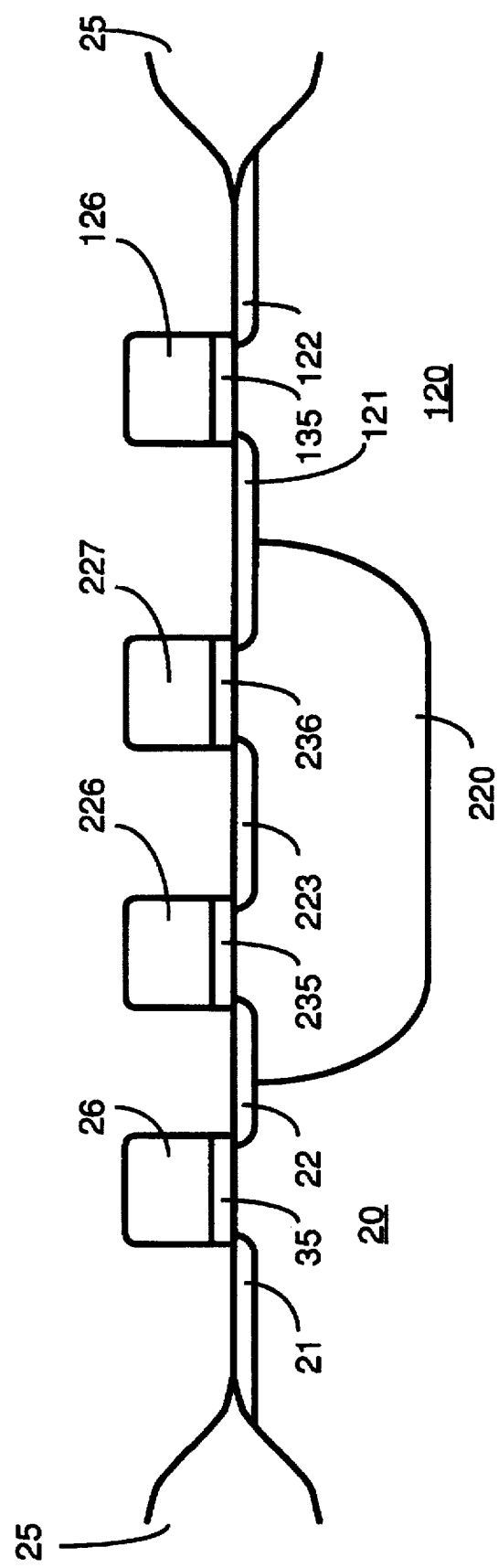
FIG. 1 shows a cross section of a double finger MOSFET output circuit in accordance with the preferred embodiment of the present invention.

FIG. 1 shows a cross section of a double finger MOSFET output circuit in accordance with the preferred embodiment of the present invention. The structure shown in FIG. 1 is formed in a well 20 and a well 21, each of first conductivity type within a substrate. For example, the substrate may be of P-type material doped with $10^{15}$ atoms per cubic centimeter. Alternately, the substrate may be of N-type material. A typical depth of the substrate is 500 microns. Well 20 and well 120 may be, for example, of P-type material doped with $10^{16}$ atoms per cubic centimeter. A well 220 is also placed within the substrate. Well 220 is of second conductivity type. For example, well 220 may be of N-type material doped with $10^{16}$ atoms per cubic centimeter.

A local oxidation of silicon (LOCOS) process or other process is used to form an insulating layer 25 of, for example, field oxide on the substrate as shown. For example, in a LOCOS process, a layer of pad oxide is deposited. On top of the pad oxide, a layer of nitride is deposited. The nitride is patterned and etched. Field oxide is grown on the substrate at places where the nitride has been etched to expose the substrate. The nitride and pad oxide are then removed.

After insulating layer 25 is formed, a layer of gate oxide is placed (i.e. grown or deposited) on exposed portions of the substrate. A gate region 26, a region 226, a region 227 and a gate region 126 are formed on the gate oxide layer using a mask and etch process. Regions 26, 226, 227 and 126 may be made of polysilicon, for example, doped with N-type atoms at $10^{20}$ atoms per cubic centimeter.

Regions 26, 226, 227 and 126 may be formed, for example, by chemical vapor deposition (CVD) of a polysilicon layer. The polysilicon is doped using $POCl_3$. Alternately, an implant of Phosphorus or Arsenic atoms may be used. If a polycide gate is desired, a metal layer is deposited on top of the polysilicon layer. A rapid thermal anneal (or other annealing process) is used to react the metal layer with the polysilicon layer. The metal-silicide layer may be formed, for example, using Titanium (Ti), Molybdenum (Mo), Chromium (Cr), Nickel (Ni), Platinum (Pt), Cobalt (Co), Tungsten (W) or Tantalum (Ta).

On top of the polysilicon (or polycide) layer there may be deposited a dielectric layer. The deposition of the dielectric layer is done, for example, using chemical vapor deposition (CVD) oxide. Alternately, deposition of the dielectric layer may be omitted. Using a mask, an etch is performed on both sides of each of regions 26, 226, 227 and 126. The etch exposes the gate oxide layer on top of the substrate.

On the sides of each of regions 26, 226, 227 and 126 are implanted regions of second conductivity type. Region 21 and region 22 act as source/drain regions for a first transistor for which gate region 26 functions as a gate. Region 121 and region 122 act as source/drain regions for a second transistor for which gate region 126 functions as a gate.

Region 223 does not act as a source/drain region because it is in well 220 which has the same conductivity type as region 21, region 223 and regions 121. Rather, a region 223 and the portions of source/drain region 22 and source drain/region 121 within well 220 are used to form resistors. A first resistor runs through source/drain region 22 across N well 220 to region 223. A second resistor runs through source/drain region 121 across N well 220 to region 223. Since the resistance through N-well region 220 is significantly higher than the resistance through regions 22, 223, and 121, varying the width of regions 226 and 227 has a significant impact on the impedance of the first and second resistors, respectively. Regions 226 and 227 may be grounded or may be left unconnected to any other circuitry in the integrated circuit.

For example, an ion implant is used to dope regions 21, 22, 223, 121 and 122 with $n^+$-type atoms at $10^{20}$ atoms per cubic centimeter.

Alternately, when a lightly doped drain (LDD) process is utilized, n¯regions may first be formed by doping with Phosphorus at $10^{17}$ atoms per cubic centimeter to a distance extending 0.15 micrometers below the surface of the substrate. A deposition and etch back may be used to form sidewall regions on opposite sides of the gate regions which serve as a spacers around the gate regions. The sidewall regions may be formed, for example by oxide deposition and etch back. Alternately, the sidewall regions may be formed by nitride deposition and etch back. For example, the sidewall regions are CVD oxide and each extends approximately 0.3 microns outward from gate regions. A dilute Hydrogen-Fluorine (HF) dip may be used to clear residual oxide over the source/drain regions. The regular $n^+$ and $p^+$ source-drain implant can then be performed on the circuit.

The exposed portions of the gate oxide layer are dipped off using, for example, a fifty to one mixture of $H_2O$ and HF. That leaves oxide regions 35, 235, 236 and 135. The result is shown in FIG. 1.

Figure 2:
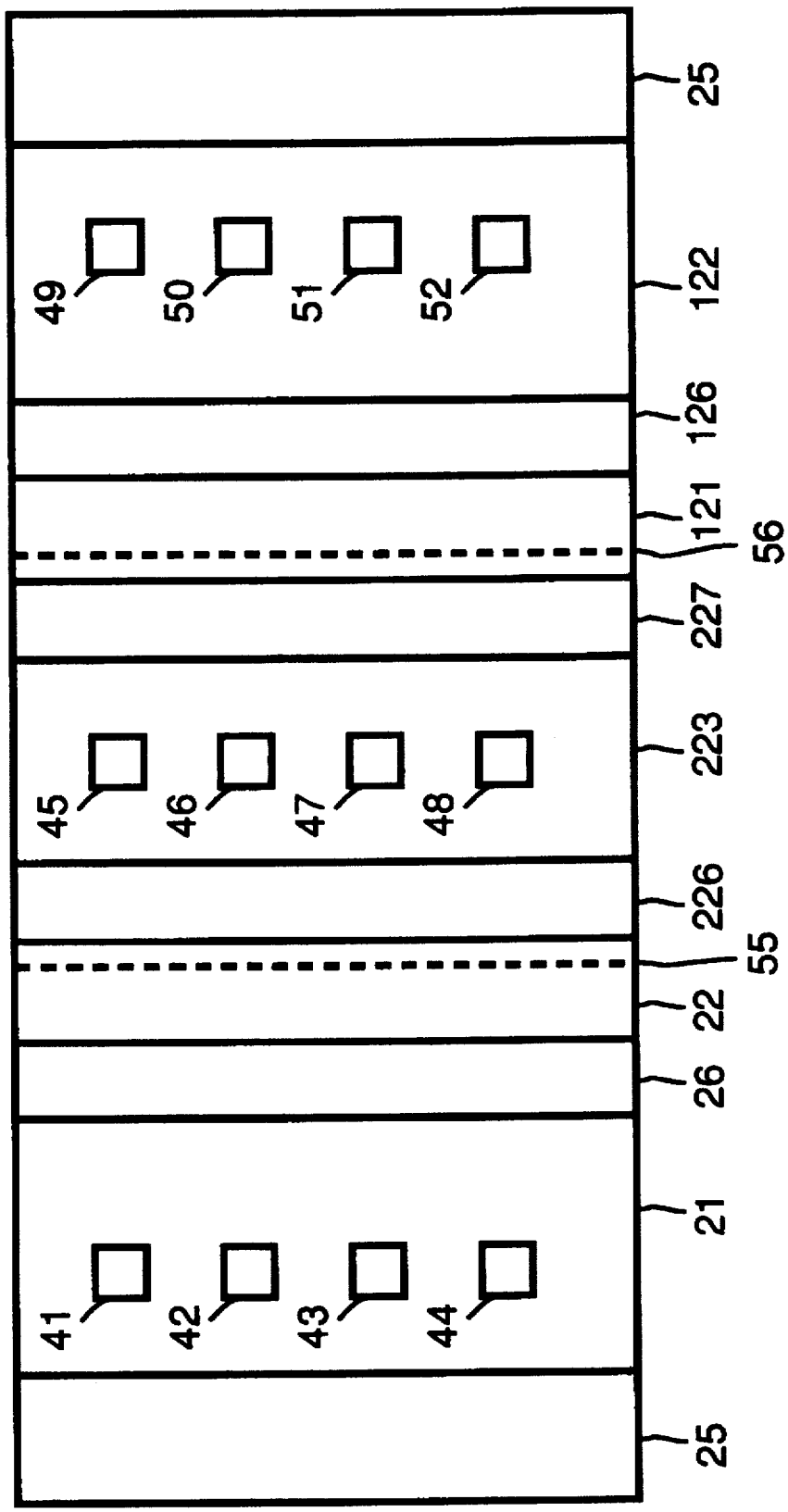
FIG. 2 shows a top view of a double finger MOSFET output circuit in accordance with the preferred embodiment of the present invention.

FIG. 2 shows a top view of the circuit shown in FIG. 1. A dotted line 55 and a dotted line 56 represent the boundaries of well 220. Contact regions 41, 42, 43, 44, 45, 46, 47, 48, 49, 50, 51 and 52 are locations where contacts are connected to the circuit.

The foregoing discussion discloses and describes merely exemplary methods and embodiments of the present invention. As will be understood by those familiar with the art, the invention may be embodied in other specific forms without departing from the spirit or essential characteristics thereof. For example, in the description above, the first conductivity type is P-type and the second conductivity type is N-type. In an alternate embodiment of the present invention, the first conductivity type may be N-type and the second conductivity type may be P-type. Accordingly, the disclosure of the present invention is intended to be illustrative, but not limiting, of the scope of the invention, which is set forth in the following claims.

I claim:

1. A method for forming a transistor comprising the steps of:

(a) forming a first region of first conductivity type;

(b) forming a well of second conductivity type, the well being adjacent to the first region;

(c) forming a gate region over a portion of the first region;

(d) forming source/drain regions of the second conductivity type on either side of the gate region, a first source/drain region extending into the well; and, (e) forming a doped region within the well, the doped region being of a same doping density as a doping density of the first source/drain region, the doped region being physically separate from the first source/drain region by a first area of the well.

2. A method as in claim 1 additionally comprising the following step:

(f) concurrent to step (c), forming a first covering over the first area of the well, the first covering having a same composition as a material composing the gate region.

3. A method as in claim 2 wherein in step (c) the gate region is formed using polysilicon.

4. A method as in claim 1 additionally comprising the following step:

(a) forming contact regions within the second source/drain region and within the doped region.

5. A method as in claim 1 wherein the first conductivity type is P-type and the second conductivity type is N-type.

6. A method as in claim 1 wherein step (d) and step (e) are performed concurrently.

* * * * *